United States Patent
Long et al.

(10) Patent No.: US 9,294,089 B2
(45) Date of Patent: Mar. 22, 2016

(54) METHOD FOR JUDGING CAPACITANCE TYPE TOUCH BUTTONS

(75) Inventors: Tao Long, Zhenjiang (CN); Zhengdong Liu, Zhenjiang (CN); Jiang Long, Zhenjiang (CN)

(73) Assignee: JIANGSU HUITONG GROUP CO., LTD, Zhenjiang, Jiangsu (CN)

( * ) Notice: Subject to any disclaimer, the term of this patent is extended or adjusted under 35 U.S.C. 154(b) by 409 days.

(21) Appl. No.: 13/882,929

(22) PCT Filed: Dec. 17, 2010

(86) PCT No.: PCT/CN2010/079927
§ 371 (c)(1),
(2), (4) Date: May 1, 2013

(87) PCT Pub. No.: WO2012/058841
PCT Pub. Date: May 10, 2012

(65) Prior Publication Data
US 2013/0214848 A1  Aug. 22, 2013

(30) Foreign Application Priority Data

Nov. 4, 2010 (CN) .......................... 2010 1 0531983

(51) Int. Cl.
*G01R 27/26* (2006.01)
*H01H 13/70* (2006.01)
*H03K 17/96* (2006.01)

(52) U.S. Cl.
CPC ...................... *H03K 17/9622* (2013.01); *H03K 2217/960725* (2013.01)

(58) Field of Classification Search
CPC .... G01R 27/2605; G01R 27/26; G01R 15/16; G01R 19/2513; G01R 26/2605; G01R 31/028; H03K 17/955; H03K 17/9622; H03K 2217/960725; G06F 15/18; G06F 3/0414; G06F 3/016; G01D 5/24; G01D 5/241; G01D 5/2412; G01D 5/2417; G06K 9/0002; G01L 1/146
USPC .............. 324/686, 750.17, 754.28, 658, 600, 324/649, 661, 662, 663, 669, 671, 684, 324/76.79, 76.81, 123 R, 123 C, 519; 702/47, 52
See application file for complete search history.

(56) References Cited

U.S. PATENT DOCUMENTS 6,466,036 B1 10/2002 Philipp
8,749,493 B2* 6/2014 Zadesky ................ G06F 3/0338
  345/173

(Continued)

FOREIGN PATENT DOCUMENTS

CN   101060321 A   10/2007
EP   1635147 A2   9/2005

(Continued)

OTHER PUBLICATIONS

International Search Report dated Jul. 21, 2011 from corresponding International Application No. PCT/CN2010/079927.

(Continued)

*Primary Examiner* — Patrick Assouad
*Assistant Examiner* — Taqi Nasir
(74) *Attorney, Agent, or Firm* — Eric D. Babych; Brinks Gilson & Lione

(57) ABSTRACT

A method for judging capacitance type touch buttons in touch sensing technical field includes that: when touching a button, determining the change trend of the charge quantity on the button; a charge regulation is performed to the charge accumulation area corresponding to each button, until the charge quantity in the charge accumulation area corresponding to the button remains unchanged; calculating the charge changing quantity of the charge accumulation area when touching the button, and calculating the ratio between the charge changing quantity of the charge accumulation area and the charge balance quantity as well; and when the change trend of the charge quantity on the button is decrease and the ratio between the charge changing quantity of the charge accumulation area corresponding to the button and the charge balance quantity is larger than or equal to the first threshold value and smaller than the third threshold value, or when the change trend of the charge quantity on the button is increase and the ratio between the charge changing quantity of the charge accumulation area corresponding to the button and the charge balance quantity is larger than or equal to the second threshold value and smaller than the third threshold value, the button is the touched button. The capacitance type touch buttons are judged more accurately according to the present invention.

19 Claims, 6 Drawing Sheets

(56) References Cited

U.S. PATENT DOCUMENTS

| | | | | |
|---|---|---|---|---|
| 2007/0279332 A1* | 12/2007 | Fryer | ............... | G06F 1/3203 345/76 |
| 2009/0135579 A1* | 5/2009 | Kim | ............... | G06F 3/03547 361/818 |
| 2010/0181180 A1* | 7/2010 | Peter | ............... | H03K 17/955 200/5 R |
| 2011/0202876 A1* | 8/2011 | Badger | ............ | G06F 3/0237 715/816 |

FOREIGN PATENT DOCUMENTS

| | | |
|---|---|---|
| EP | 2068231 A2 | 6/2009 |
| JP | 03-289715 | 12/1991 |
| JP | 04-082415 | 3/1992 |
| JP | 11-134986 | 5/1999 |
| JP | 2005526337 A | 9/2005 |
| JP | 2007208682 | 8/2007 |
| JP | 2008293887 A | 12/2008 |
| JP | 2010152876 A | 7/2010 |
| KR | 2010007532 A | 7/2010 |

OTHER PUBLICATIONS

European Search Report dated Oct. 9, 2014 for Application No. EP10859189.2.

Office Action in Japanese Counterpart Application No. 2013-536979 dated Jun. 2, 2014.

* cited by examiner

METHOD FOR JUDGING CAPACITANCE TYPE TOUCH BUTTONS

CROSS-REFERENCE TO RELATED APPLICATIONS

The present application is a Section 371 National Stage Application of International Application No. PCT/CN2010/079927, filed on Dec. 17, 2010, which claims priority to Chinese patent application No. 201010531983.3, filed on Nov. 4, 2010, and entitled "METHOD FOR JUDGING CAPACITANCE TYPE TOUCH BUTTONS", and the entire disclosure of which is incorporated herein by reference.

FIELD OF THE DISCLOSURE

The present disclosure generally relates to touch sensing technology, and more particularly, to a method for detecting capacitive touch keys.

BACKGROUND OF THE DISCLOSURE

Touch key is a kind of touch sensing input device, which is widely used in cell phone, television and other media devices. According to touch sensing principle, touch keys can be divided into resistive touch keys, capacitive touch keys and so on. Capacitive touch keys draw wide attentions in the industry, due to their high light transmittance, extended life, high resistance to abrasions, environment temperature and humidity variations, and their improved performances such as multi-point touch function. The capacitive touch key can detect a touch event from a finger through insulating materials, e.g., glass or plastic, and determine whether the touch event is an effective one without mechanical buttons as in conventional keys. This process is based on following theories: an increment in capacitance, generated by a finger touching a touch key's sensing area, is added to an inherent capacitance amount of the touch key device to obtain a new capacitance amount, and a touch detection control circuit may process the new capacitance amount to generate corresponding control commands, thereby realizing control.

According to power supply, touch keys can be divided into primary and secondary coil common ground touch keys and primary and secondary coil non common ground touch keys. Referring to FIG. 1, for a primary and secondary coil common ground touch key, when the key is being touched by a finger, a body, as a large capacitor $C_F$, may be connected to the ground. Meanwhile, a sensing capacitor $C_P$ of the key may connect with the ground as well. As a result, the capacitor $C_F$ and $C_P$ are in parallel. Referring to FIG. 2, for a primary and secondary coil non common ground touch key, when the key is being touched by a finger, a body, as a large capacitor $C_F$, may be connected to the ground. And a sensing capacitor $C_P$ of the key may connect with a direct current ground. Thus, the capacitor $C_F$ and $C_P$ are not in parallel.

In conventional methods, key detection is always performed based on capacitance variation to ground. In no ground situation, current leak may occur. If touch detection is still performed by employing a conventional method, a false detection result may be obtained, leading to false key detection.

Therefore, a new method for detecting key more accurately is desired.

SUMMARY

Embodiments of the present disclosure may improve the accuracy in detecting capacitive touch keys.

In an embodiment, a method for detecting capacitive touch key may include steps of:

when a touch key is being touched, determining change trends of charge amounts in each charge accumulation region corresponding to a key, where the change trends include increment and decrement;

performing charge adjustment to each charge accumulation region corresponding to a key until charge amounts in each charge accumulation region corresponding to a key reach stability;

calculating charge change amounts in each charge accumulation region when the touch key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the touch key is touched;

when the change trend of charge amount in the charge accumulation region corresponding to a key is decrement, and the ratio of the charge change amount to the charge balance amount in the charge accumulation region corresponding to the key is greater than a first threshold and less than a third threshold, or is equal to the first threshold and less than the third threshold, determining the key is being touched; and when the change trend of charge amount in the charge accumulation region corresponding to the key is increment, and the ratio of the charge change amount to the charge balance amount in the charge accumulation region corresponding to the key is greater than a second threshold and less than the third threshold, or is equal to the second threshold and less than the third threshold, determining the key is being touched;

where an insulating dielectric layer is formed on the periphery of each key, a metal layer is formed on the periphery of the insulating dielectric layer, metal shield rings are formed between adjacent keys, and each key is connected with a standard unit capacitor.

Optionally, determining change trends of charge amounts in each charge accumulation region corresponding to a key may include: when the key is being touched, if the equivalent capacitance of body and the key decreases, the change trend of charge amount in the charge accumulation region corresponding to the key is determined to be decrement; if the equivalent capacitance of a body and the key increases, the change trend of charge amount in the charge accumulation region corresponding to the key is determined to be increment.

Optionally, performing charge adjustment to each charge accumulation region corresponding to a key may include: performing charge supplement to the charge accumulation regions by discharging of the standard unit capacitor until charge amounts in each charge accumulation region corresponding to a key reach stability.

Optionally, performing charge adjustment to each charge accumulation region corresponding to a key may include: performing charge adjustment to each charge accumulation region corresponding to a key at a fixed time interval and each charge adjustment action making charge amounts in each charge accumulation region corresponding to a key reach stability.

Optionally, the fixed time interval may be 5 µs.

Optionally, the standard unit capacitor may be a hold capacitor in a sampling hold circuit of an Analog-to-Digital Converter (ADC), and the discharging of the standard unit capacitor may be controlled by sampling pulses.

Optionally, frequency of the sampling pulses may range from 80 kHz to 120 kHz.

Optionally, the sampling pulses may employ a same frequency.

Optionally, the sampling pulses may employ different frequencies.

Optionally, the sampling pulses employ different frequencies, where after a charge adjustment action for the first time, sampling pulses employ a larger frequency in a current charge adjustment action than that in a previous one.

Optionally, the sampling pulses employ different frequencies, where a frequency varying range is predetermined for sampling pulses; sampling pulses employ a larger frequency in a current charge adjustment action than that in a previous one; and after the frequency of sampling pulses in a charge adjustment action reaches an the highest one in the range, sampling pulses employ a lower frequency in a current charge adjustment action than that in a previous one.

Optionally, when the change trend of charge amount in the charge accumulation region is decrement, the charge adjustment amount in the charge accumulation region is a charge supplement amount to the charge accumulation region of the standard unit capacitor; when the change trend of charge amount in the charge accumulation region is increment, the charge adjustment amount in the charge accumulation region is a difference between a charge amount in the charge accumulation region when the charge amount reaches stability and a charge balance amount.

Optionally, calculating charge change amounts in each charge accumulation region when the touch key is being touched according to charge adjustment amounts in each charge accumulation region corresponding to a key may include: using a charge adjustment amount in a first charge adjustment action as a charge change amount in the first charge adjustment action; from a second charge adjustment action, calculating a weighted sum of a charge adjustment amount in a current charge adjustment action and a charge adjustment amount in a previous charge adjustment action, and taking the weighted sum as a charge change amount in the current charge adjustment action; and averaging charge change amounts in all the charge adjustment actions to obtain an average value and taking the average value as a charge change amount when the key is being touched.

Optionally, the weighted sum is calculated based on the following formula:

$$C = C_1 \times N1 + C_2 \times N2,$$

where C is a charge change amount in the current charge adjustment action, $C_1$ is a charge adjustment amount in the previous charge adjustment action, $N_1$ is a first weight of the previous charge adjustment action, $C_2$ is a charge adjustment amount in the current charge adjustment action, $N_2$ is a second weight of the current charge adjustment action, and the sum of $N_1$ and $N_2$ is 1.

Optionally, the first weight may be less than the second weight.

Optionally, the first weight may be ⅓ and the second weight may be ⅔.

Optionally, the first threshold may be less than the second threshold.

Optionally, the first threshold may be 1% and the second threshold may be 5%.

Optionally, the third threshold may be 10%.

Compared with the conventional methods, the present disclosure has following advantages. Standard unit capacitors are employed to perform charging to make charge amounts in all the charge accumulation regions corresponding to a key reach stability, thereby avoiding the disadvantage of applying capacitance to ground to determine keys in non ground situation in the conventional methods. Furthermore, two determination standards including a first and a second threshold bring about a more accurate detection for capacitive touch keys. Besides, a third threshold further eliminates external interference.

DETAILED DESCRIPTION OF THE DISCLOSURE

Figure 1:
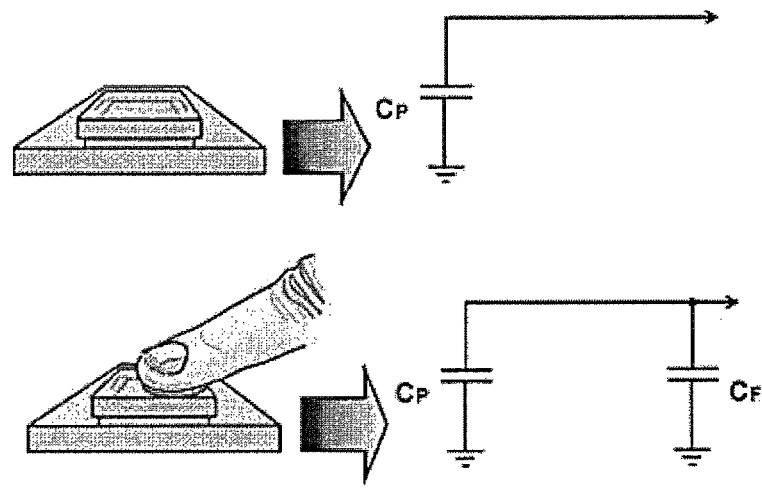
FIG. 1 schematically illustrates the relationship between capacitors when a primary and secondary coil common ground touch key is being touched in the prior art.
Figure 2:
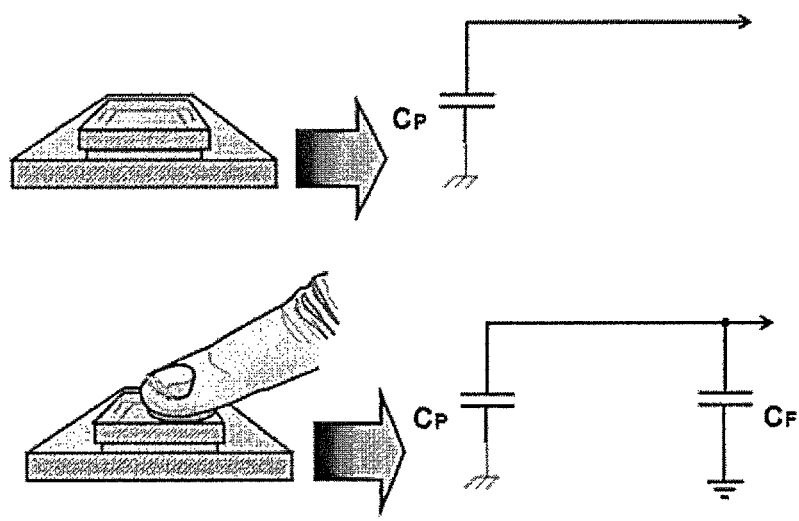
FIG. 2 schematically illustrates the relationship between capacitors when a primary and secondary coil non common ground touch key is being touched in the prior art.

In order to clarify the objects, characteristics and advantages of the disclosure, embodiments of present disclosure will be described in detail in conjunction with accompanying drawings.

In the following description, for the purposes of explanation, numerous specific details are set forth in order to provide a thorough understanding of the present disclosure. It will be apparent, however, to those skilled in the art that the present disclosure may be practiced with other embodiments different from embodiments described below. Accordingly, the present disclosure is not restricted to the embodiments described herein.

As described in the background of the disclosure, in conventional methods, key detection is always performed based on capacitance variation to ground. In no ground situation, current leak may occur, which may cause false key detection.

To improve the accuracy in detecting capacitive touch keys, embodiments of the present disclosure provide a method for detecting capacitive touch keys, including steps of:

when a touch key is being touched, determining change trends of charge amounts in each charge accumulation region corresponding to a key, where the change trends include increment and decrement;

performing charge adjustment to each charge accumulation region corresponding to a key until charge amounts in each charge accumulation region corresponding to a key reach stability;

calculating charge change amounts in each charge accumulation region when the touch key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the touch key is touched;

when the change trend of charge amount in the charge accumulation region corresponding to the key is decrement, and the ratio of the charge change amount to the charge balance amount in the charge accumulation region corresponding to the key is greater than a first threshold and less than a third threshold, or is equal to the first threshold and less than the third threshold, determining the key is being touched; and when the change trend of charge amount in the charge accumulation region corresponding to the key is increment, and the ratio of the charge change amount to the charge balance amount in the charge accumulation region corresponding to the key is greater than a second threshold and less than the third threshold, or is equal to the second threshold and less than the third threshold, determining the key is being touched;

where an insulating dielectric layer is formed on the periphery of each key, a metal layer is formed on the periphery of the insulating dielectric layer, metal shield rings are formed between adjacent keys, and each key is connected with a standard unit capacitor.

In the present disclosure, to ensure that charge amounts in each charge accumulation region corresponding to a key reach stability, standard unit capacitors are employed to perform charging. Therefore, the disadvantage of applying capacitance to ground to detect keys in non ground situation in the conventional methods is avoided. Furthermore, two determination standards including a first and a second threshold bring about a more accurate detection for capacitive touch keys. Besides, a third threshold further eliminates external interference.

First Embodiment

Figure 3:
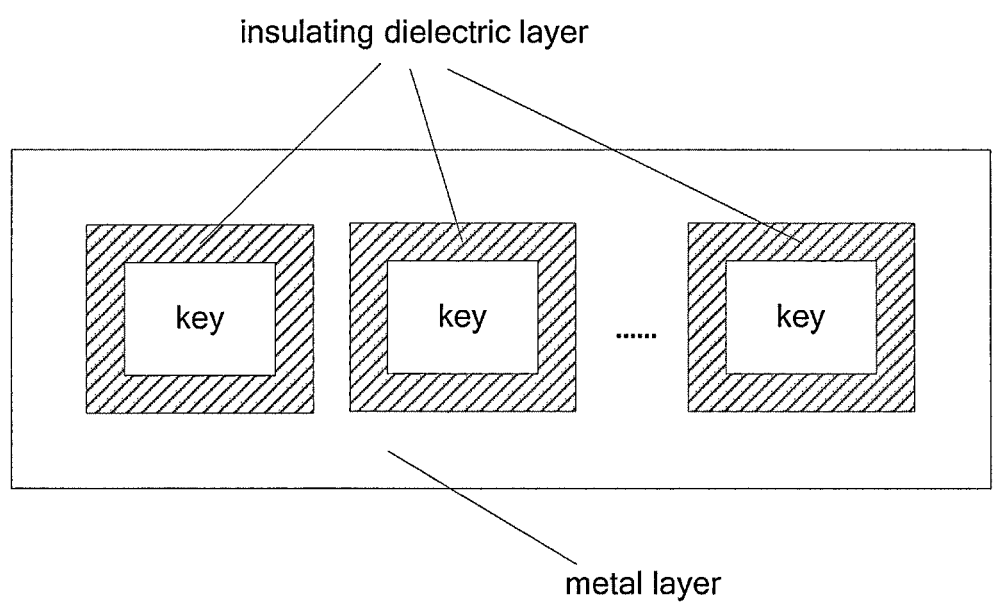
FIG. 3 schematically illustrates a structural diagram of a capacitive touch key according to one embodiment of the present disclosure.

In the embodiment, the key is a primary and secondary coil common ground capacitive touch copper foil key. As shown in FIG. 3, an insulating dielectric layer is formed on the periphery of each key, a metal layer is formed on the periphery of the insulating dielectric layer, metal shield rings are formed between adjacent keys, and each key is connected with a standard unit capacitor. The metal layer is configured to increase a charge accumulation amount in the charge accumulation region corresponding to the key and improve the sensibility of detection.

Before the key detection, some initialization processes may be performed, including: detecting background environmental signals, shielding signals whose frequencies are beyond a range from a first frequency (80 KHZ in the embodiment) to a second frequency (120 KHZ in the embodiment) and generating a trigger signal after a signal whose frequency is between the first frequency and the second frequency is detected. The trigger signal is configured to trigger the touch detection process.

According to the embodiment, a key detection method may include steps of:

S100, when a key is being touched, determining change trends of charge amounts in each charge accumulation region corresponding to a key, where the change trends include increment and decrement;

S110, performing charge adjustment to each charge accumulation region corresponding to a key until charge amounts in each charge accumulation region corresponding to a key reach stability;

S120, calculating charge change amounts in each charge accumulation region when the key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the key is touched; and S130, when the change trend of charge amount in the charge accumulation region corresponding to the key is decrement, and the ratio of the charge change amount to the charge balance amount in the charge accumulation region corresponding to the key is greater than a first threshold and less than a third threshold, or is equal to the first threshold and less than the third threshold, determining the key is being touched; when the change trend of charge amount in the charge accumulation region corresponding to the key is increment, and the ratio of the charge change amount to the charge balance amount in the charge accumulation region corresponding to the key is greater than a second threshold and less than the third threshold, or is equal to the second threshold and less than the third threshold, determining the key is being touched.

Figure 4:
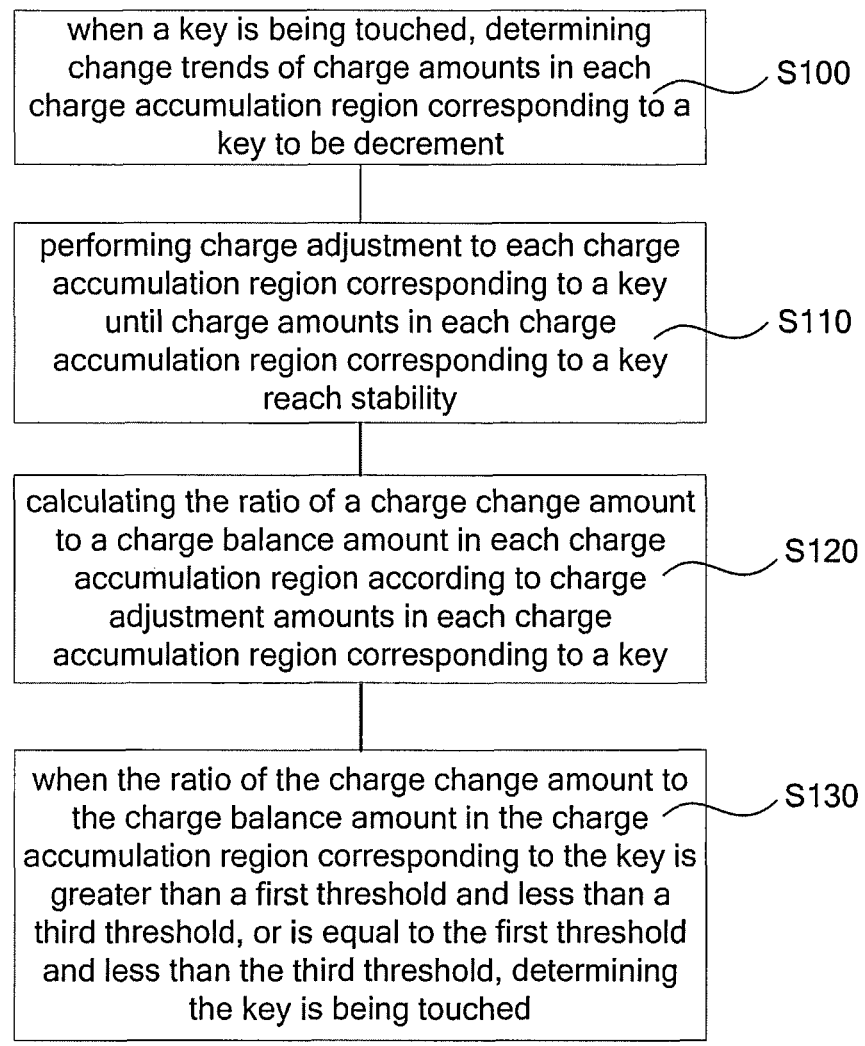
FIG. 4 schematically illustrates a flow chart of a method for detecting capacitive touch keys according to a first embodiment of the present disclosure.

FIG. 4 schematically illustrates a flow chart of a method for detecting capacitive touch keys according to the embodiment. The detection is described in detail herein.

First, S100 is performed as follows: when a key is being touched, determining change trends of charge amounts in each charge accumulation region corresponding to a key, where the change trends include increment and decrement.

The key in the embodiment is a primary and secondary coil common ground capacitive touch key. Namely, in the Alternating Current-Direct Current (AC-DC) power supply applied by the key, a primary coil and a secondary coil are on common ground. When the key is being touched by a finger, a body capacitor is grounded and a sensing capacitor of the key is grounded as well. The sensing capacitor and the body capacitor are in parallel. Since the body capacitor is much greater than the sensing capacitor of the key, charges in the charge accumulation region corresponding to the key may be discharged to the ground along the body capacitor, resulting in a decrement in the charge amount in the charge accumulation region. Therefore, in the embodiment, the change trend of the charge amount in the charge accumulation region corresponding to the key is decrement, namely, when the primary and secondary coil common ground capacitive touch key is being touched, the change trend of the charge amount in the charge accumulation region corresponding to the key is decrement.

Above conclusion is obtained based on a know situation that a primary coil and a secondary coil are on common ground in the AC-DC power supply. However, in practice, a type of key should be determined first during key detection. Therefore, determining change trends of charge amounts in each charge accumulation region corresponding to a key may include: when a key is being touched, if the equivalent capacitance of a body and the touch key decreases, the change trend of charge amount in the charge accumulation region corresponding to the key is determined to be decrement; if the equivalent capacitance of a body and the touch key increases, the change trend of charge amount in the charge accumulation region corresponding to the key is determined to be increment. In the embodiment, the equivalent capacitance of the body and the key decreases when the key is being touched, and the change trend of charge amount in the charge accumulation region corresponding to the key is decrement.

Thereafter, S110 is performed as follows: performing charge adjustment to each charge accumulation region corresponding to a key until charge amounts in each charge accumulation region corresponding to a key reach stability.

When the copper foil key is being touched, the charge amount in a charge accumulation region of a copper foil corresponding to the key is changed significantly. In the embodiment, a charge amount in the charge accumulation region corresponding to the key decreases greatly. To make charge amounts in each charge accumulation region corresponding to a key reach stability, it is necessary to perform charge supplement to each charge accumulation region corresponding to a key. Performing charge supplement may include: performing charge supplement to the charge accumulation regions by the discharging of the standard unit capacitor until charge amounts in each charge accumulation region corresponding to a key reach stability. In the embodiment, the charge amounts reaching stability means the charge amounts in the charge accumulation regions reach a charge balance amount. The charge balance amount refers to the charge amount in the charge accumulation region before the key is touched.

In some embodiments, to calculate a charge supplement amount more precisely in the duration of one touch event, it is better to divide the duration into a plurality of sub durations and record a charge supplement amount in each of the plurality of sub durations. The more the sub durations is, the precise the calculation is. However, it takes much time to charge and discharge a capacitor with large capacitance. Therefore, division of the duration is limited greatly. In the embodiment, charge supplement is performed by employing a sampling hold circuit of an ADC according to the conventional technologies and the discharging of the standard unit capacitors is controlled by sampling pulses.

Figure 5:
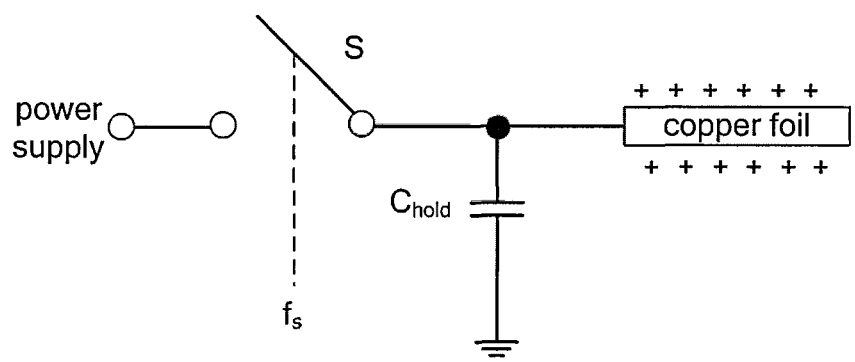
FIG. 5 schematically illustrates a structural diagram of charge supplement for a charge accumulation region through a hold capacitor in a sampling hold circuit of an ADC according to a first embodiment of the present disclosure.

Referring to FIG. 5, the sampling hold circuit may include: an analog electronic switch S and a hold capacitor $C_{hold}$. The analog electronic switch S may be turned on/off repeatedly under the control of sampling pulses with a frequency of $f_s$. When the analog electronic switch S is turned on, a power supply charges the hold capacitor $C_{hold}$; otherwise, the hold capacitor $C_{hold}$ keeps its voltage unchanged.

In the embodiment, a copper foil is connected with a hold capacitor $C_{hold}$. When an analog electronic switch S is turned off, the hold capacitor $C_{hold}$ discharges charges to the copper foil and the copper foil is charged. Therefore, charges are accumulated in charge accumulation regions on a surface of the copper foil because of the charges released by the hold capacitor $C_{hold}$. Through controlling the frequency $f_s$ of sampling pulses, charging and discharging to the hold capacitor $C_{hold}$ can be performed rapidly, thereby charges are supplemented to the charge accumulation regions constantly. In a relatively short time, charge amounts in the charge accumulation regions may reach stability. In this manner, a whole charge supplement process may be divided into several charge supplement processes. In some embodiments, the hold capacitor $C_{hold}$ may have a capacitance of 0.5 pF.

Besides precise calculation of charge supplement amount, the charge supplement actions should be set reasonably.

Specifically, charge supplement may be performed to each charge accumulation region corresponding to a key in a touch key structure at a fixed time interval. And after each charge supplement action, charge amounts in the charge accumulation regions reach stability. During a charge supplement action, frequency of sampling pulses of the analog electric switch S may be set according to analysis of an actual touch situation and the accuracy of touch detection. For example, sampling pulses used to control the discharging of the hold capacitor may employ a same frequency or different frequencies at each charge supplement action. Preferably, different frequencies are employed.

In the embodiment, sampling pulses employ different frequencies at each charge supplement action, where after a charge adjustment action for the first time, sampling pulses employ a larger frequency in a current charge adjustment action than that in a previous one. A frequency varying range may be predetermined for sampling pulses. The frequency of sampling pulses in a first charge supplement action may be set to be the lowest one in the range; sampling pulses employ a little larger frequency in a second charge supplement action than that in the first charge supplement action; and sampling pulses employ a little larger frequency in a third charge supplement action than that in the second charge supplement action, and so on, until the frequency of sampling pulses in the latest charge supplement action reaches a relatively higher value or the highest one in the range. In some embodiments, a charge supplement action may be performed at a fixed time interval.

In the embodiment, the fixed time interval may be 5 μs and the frequency of sampling pulses may range from 80 kHz to 120 kHz.

To determine whether charge amounts in each charge accumulation region corresponding to a key have reached stability, the charge balance amounts in each charge accumulation region corresponding to a key may be recorded in advance, and a real-time comparison between amounts of accumulated charges and corresponding charge balance amounts in the charge accumulation regions may be performed during charge supplement.

Thereafter, S120 is performed as follows: calculating charge change amounts in each charge accumulation region when the key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the key is touched.

To calculate charge change amounts in each charge accumulation region of a copper foil corresponding to a key in the duration of one touch event accurately, it is necessary to comprehensively process a plurality of charge supplement amounts obtained by multiple charge supplement actions to obtain the charge change amounts.

Figure 6:
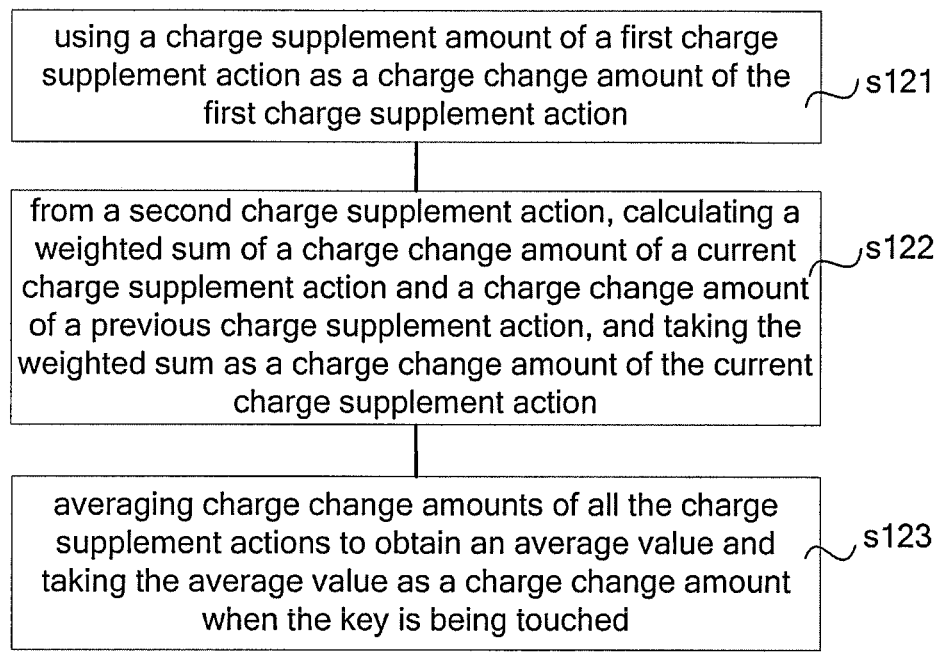
FIG. 6 schematically illustrates a flow chart of a method for calculating charge change amount according to a first embodiment of the present disclosure.

Referring to FIG. 6, comprehensively processing a plurality of charge supplement amounts may include steps of:

Step S121, using a charge supplement amount in a first charge supplement action as a charge change amount in the first charge supplement action;

Step S122, from a second charge supplement action, calculating a weighted sum of a charge supplement amount in a current charge supplement action and a charge supplement amount in a previous charge supplement action, and taking the weighted sum as a charge change amount in the current charge supplement action; and Step S123, averaging charge change amounts of all the charge supplement actions to obtain an average value and taking the average value as a charge change amount when the key is being touched.

The weighted sum is calculated based on the following formula: $C=C_1 \times N1 + C_2 \times N2$, where C is a charge change amount in the current charge supplement action, $C_1$ is a charge supplement amount in the previous charge supplement action, $N_1$ is a first weight of the previous charge supplement action, $C_2$ is a charge supplement amount in the current charge supplement action, $N_2$ is a second weight of the current charge supplement action, and the sum of $N_1$ and $N_2$ is 1.

Considering that C is more relative with $C_2$ than with $C_1$, $N_2$ should be greater than $N_1$. In the embodiment, the first weight $N_1$ is ⅓ and the second weight $N_2$ is ⅔. In some embodiments, the first weight $N_1$ may be ¼ or ⅖. Accordingly, the second weight $N_2$ may be ¾ or ⅗.

After calculating the charge change amounts in each charge accumulation region of a copper foil corresponding to a key, a ratio of a charge change amount in each charge accumulation region to a corresponding charge balance amount may be obtained.

Thereafter, S130 is performed as follows: when the ratio of the charge change amount to the charge balance amount in the charge accumulation region corresponding to the key is greater than a first threshold and less than a third threshold, or is equal to the first threshold and less than the third threshold, determining the key is being touched.

In the embodiment, the first threshold is 1% and the third threshold is 10%. In practice, charges in a charge accumulation region corresponding to the key may be absorbed almost when the key is touched by a finger, and other interference hardly causes absorption of charges. Therefore, the first threshold may be relatively smaller. Namely, once 1% of charges in the charge accumulation region corresponding to the key are absorbed, the key is determined to be touched.

Second Embodiment

In the embodiment, the key is a primary and secondary coil non common ground capacitive touch copper foil key. As shown in FIG. 3, an insulating dielectric layer is formed on the periphery of each key, a metal layer is formed on the periphery of the insulating dielectric layer, metal shield rings are formed between adjacent keys, and each key is connected with a standard unit capacitor.

Before the key detection, some initialization processes may be performed, including: detecting background environmental signals, shielding signals whose frequencies are beyond a range from a first frequency (80 KHZ in the embodiment) to a second frequency (120 KHZ in the embodiment) and generating a trigger signal after a signal whose frequency is between the first frequency and the second frequency is detected. The trigger signal is configured to trigger the touch detection process.

According to the embodiment, a key detection method may include steps of:

S200, when a key is being touched, determining change trends of charge amounts in each charge accumulation region corresponding to a key, where the change trends include increment and decrement;

S210, performing charge adjustment to each charge accumulation region corresponding to a key until charge amounts in each charge accumulation region corresponding to a key reach stability;

S220, calculating charge change amounts in each charge accumulation region when the key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the key is touched; and S230, when the change trend of charge amount in the charge accumulation region corresponding to the key is decrement, and the ratio of the charge change amount to the charge balance amount in the charge accumulation region corresponding to the key is greater than a first threshold and less than a third threshold, or is equal to the first threshold and less than the third threshold, determining the key is being touched; when the change trend of charge amount in the charge accumulation region corresponding to the key is increment, and the ratio of the charge change amount to the charge balance amount in the charge accumulation region corresponding to the key is greater than a second threshold and less than the third threshold, or is equal to the second threshold and less than the third threshold, determining the key is being touched.

Figure 7:
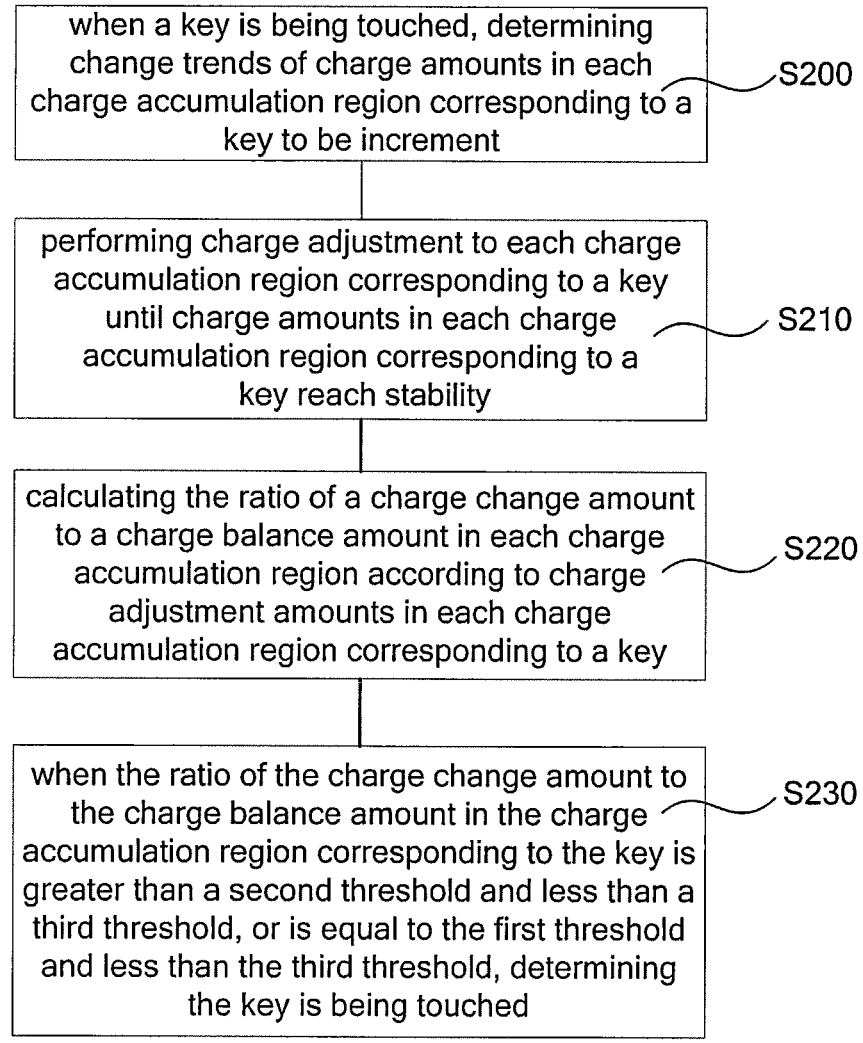
FIG. 7 schematically illustrates a flow chart of a method for detecting capacitive touch keys according to a second embodiment of the present disclosure.

FIG. 7 schematically illustrates a flow chart of a method for detecting capacitive touch keys according to the embodiment. The detection is described in detail herein.

First, S200 is performed as follows: when a key is being touched, determining change trends of charge amounts in each charge accumulation region corresponding to a key, where the change trends include increment and decrement.

The key in the embodiment is a primary and secondary coil non common ground capacitive touch key. Namely, in the AC-DC power supply applied by the key, a primary coil and a secondary coil are not on common ground. When the key is being touched by a finger, a body as a capacitor is grounded, and a sensing capacitor of the key is not grounded. The sensing capacitor and the body capacitor are not in parallel. One end of the body capacitor is connected with one end of the sensing capacitor of the key, but their other ends are not connected. As capacitance of the body capacitor is much greater than that of the sensing capacitor of the key, the charge accumulation region corresponding to the key may obtain charges from static electricity of the body. Thus, charges in the charge accumulation region do not decrease but increase, resulting in an increment in the charge amount in the charge accumulation region. Therefore, in the embodiment, the change trend of the charge amount in the charge accumulation region corresponding to the key is increment, namely, when the primary and secondary coil non common ground capacitive touch key is being touched, the change trend of the charge amount in the charge accumulation region corresponding to the key is increment:

Above conclusion is obtained based on a know situation that a primary coil and a secondary coil are not on common ground in the AC-DC power supply. However, in practice, a type of key should be determined first during key detection. Therefore, determining change trends of charge amounts in each charge accumulation region corresponding to a key may include: when a key is being touched, if the equivalent capacitance of a body and the touch key decreases, the change trend of charge amount in the charge accumulation region corresponding to the key is determined to be decrement; if the equivalent capacitance of a body and the touch key increases, the change trend of charge amount in the charge accumulation region corresponding to the key is determined to be increment. In the embodiment, the equivalent capacitance of the body and the key increases when the key is being touched, and the change trend of charge amount in the charge accumulation region corresponding to the key is increment.

Thereafter, S210 is performed as follows: performing charge adjustment to each charge accumulation region corresponding to a key until charge amounts in each charge accumulation region corresponding to a key reach stability.

When the copper foil key is being touched, the charge amount in a charge accumulation region of a copper foil corresponding to the key is changed significantly. In the embodiment, a charge amount in the charge accumulation region corresponding to the key increases greatly. Since charge accumulation regions can store limited charges, it is necessary to perform charge supplement to each charge accumulation region corresponding to a key. Performing charge supplement may include: performing charge supplement to the charge accumulation regions by employing the discharging of the standard unit capacitor until charge amounts in each charge accumulation region corresponding to a key reach stability. In the embodiment, the charge amounts reaching stability means the charge amounts in the charge accumulation regions reach a maximum value, namely, charges reach a dynamic balance. Specifically, when the charge amounts reach the maximum value, the sampling hold capacitors may still perform charging to the charge accumulation regions. Charges formed in the process of charging after the charge amounts reach the maximum value may flow back to the sampling hold capacitors, thereby realizing a dynamic balance.

The charge supplement amount in the charge accumulation region may be obtained by detecting the charge amount in the charge accumulation region when the charge amount reaches stability and subtracting the charge amount by the charge balance amount.

In some embodiments, to calculate the charge supplement amount more precisely in the duration of one touch event, it is better to divide the duration into a plurality of sub durations and record a charge supplement amount in each of the plurality of sub durations. The more the sub durations is, the precise the calculation is. However, it takes much time to charge and discharge a capacitor with large capacitance. Therefore, division of the duration is limited greatly. In the embodiment, charge supplement is performed by employing a sampling hold circuit of an ADC according to the conventional technologies and the discharging of the standard unit capacitors is controlled by sampling pulses.

Figure 8:
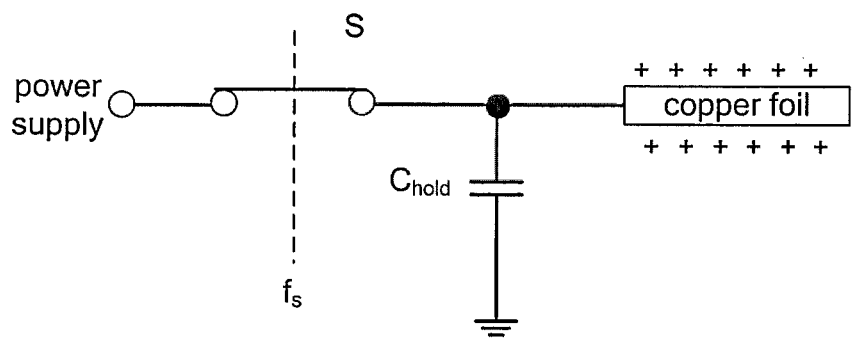
FIG. 8 schematically illustrates a structural diagram of charge supplement for a charge accumulation region through a hold capacitor in a sampling hold circuit of an ADC according to a second embodiment of the present disclosure.

Referring to FIG. 8, the sampling hold circuit may include: an analog electronic switch S and a hold capacitor $C_{hold}$. The analog electronic switch S may be turned on/off repeatedly under the control of sampling pulses with a frequency of $f_s$. When the analog electronic switch S is turned on, a power supply charges the hold capacitor $C_{hold}$; otherwise, the hold capacitor $C_{hold}$ keeps its voltage unchanged.

In the embodiment, a copper foil is connected with a hold capacitor $C_{hold}$. When an analog electronic switch S is turned off, the hold capacitor $C_{hold}$ discharges charges to the copper foil and the copper foil is charged. Therefore, charges are supplemented to charge accumulation regions on a surface of the copper foil because of the charges released by the hold capacitor $C_{hold}$. Through controlling the frequency $f_s$ of sampling pulses, discharging to the hold capacitor $C_{hold}$ can be performed rapidly, thereby charges are supplemented to the charge accumulation regions constantly. In a relatively short time, charge amounts in the charge accumulation regions may reach a maximum value. In this manner, a whole charge supplement process may be divided into several charge supplement processes. In some embodiments, the hold capacitor $C_{hold}$ may have a capacitance of 0.5 pF.

Besides precise calculation of charge supplement amount, the charge supplement actions should be set reasonably.

Specifically, charge supplement may be performed to each charge accumulation region corresponding to a key in a touch key structure at a fixed time interval. And after each charge supplement action, charge amounts in the charge accumulation regions reach the maximum value. During a charge supplement action, frequency of sampling pulses of the analog electric switch S may be set according to analysis of an actual touch situation and the accuracy of touch detection. For example, sampling pulses used to control the discharging of the hold capacitor may employ a same frequency or different frequencies at each charge supplement action. Preferably, different frequencies are employed.

In the embodiment, sampling pulses employ different frequencies at each charge supplement action, where after a charge adjustment action for the first time, sampling pulses employ a larger frequency in a current charge adjustment action than that in a previous one. A frequency varying range may be predetermined for sampling pulses. The frequency of sampling pulses in a first charge supplement action may be set to be the lowest one in the range; sampling pulses employ a little larger frequency in a second charge supplement action than that in the first charge supplement action; and sampling pulses employ a little larger frequency in a third charge supplement action than that in the second charge supplement action, and so on, until the frequency of sampling pulses in the latest charge supplement action reaches a relatively higher value or the highest one in the range. In some embodiments, a charge supplement action may be performed at a fixed time interval.

In the embodiment, the fixed time interval may be 5 μs and the frequency of sampling pulses may range from 80 kHz to 120 kHz.

Thereafter, S220 is performed as follows: calculating charge change amounts in each charge accumulation region when the key is being touched according to charge adjustment amounts in each charge accumulation region corresponding to a key, and calculating the ratio of the charge change amount to a charge balance amount in each charge accumulation region, where the charge balance amount is the charge amount in each charge accumulation region before the key is touched.

To calculate charge change amounts in each charge accumulation region of a copper foil corresponding to a key in the duration of one touch event accurately, it is necessary to comprehensively process a plurality of charge supplement amounts obtained by multiple charge supplement actions to obtain the charge change amounts.

Figure 9:
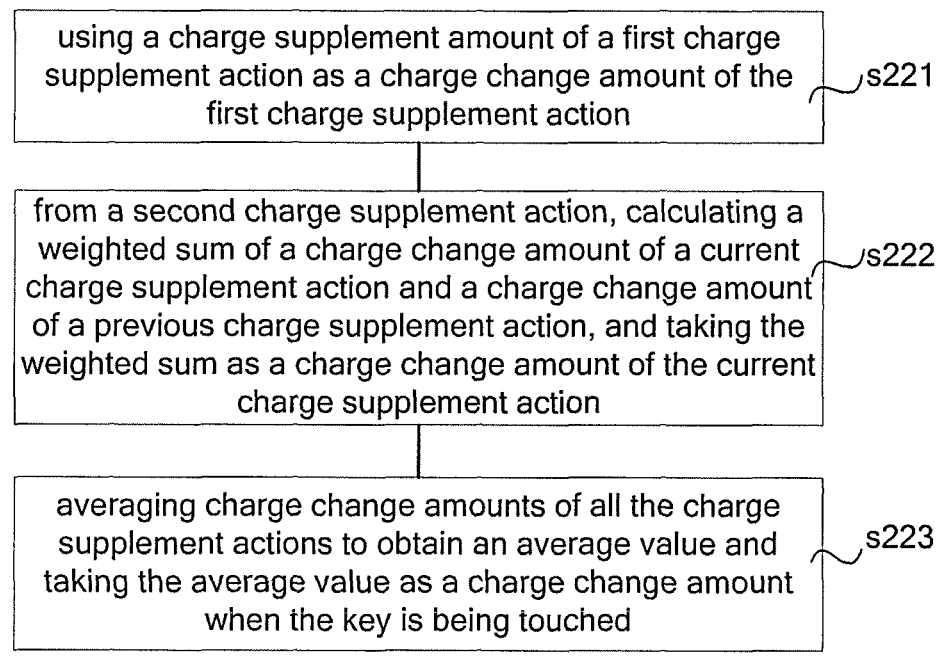
FIG. 9 schematically illustrates a flow chart of a method for calculating charge change amount according to a second embodiment of the present disclosure.

Referring to FIG. 9, comprehensively processing a plurality of charge supplement amounts may include steps of:

Step S221, using a charge supplement amount in a first charge supplement action as a charge change amount in the first charge supplement action;

Step S222, from a second charge supplement action, calculating a weighted sum of a charge supplement amount in a current charge supplement action and a charge supplement amount in a previous charge supplement action, and taking the weighted sum as a charge change amount in the current charge supplement action; and Step S223, averaging charge change amounts of all the charge supplement actions to obtain an average value and taking the average value as a charge change amount when the key is being touched.

The weighted sum is calculated based on the following formula: $C = C_1 \times N1 + C_2 \times N2$, where C is a charge change amount in the current charge supplement action, $C_1$ is a charge supplement amount in the previous charge supplement action, $N_1$ is a first weight of the previous charge supplement action, $C_2$ is a charge supplement amount in the current charge supplement, $N_2$ is a second weight of the current charge supplement action, and the sum of $N_1$ and $N_2$ is 1.

Considering that C is more relative with $C_2$ than with $C_1$, $N_2$ should be greater than $N_1$. In the embodiment, the first weight $N_1$ is ⅓ and the second weight $N_2$ is ⅔. In some embodiments, the first weight $N_1$ may be ¼ or ⅖. Accordingly, the second weight $N_2$ may be ¾ or ⅗.

After calculating the charge change amounts in each charge accumulation region of a copper foil corresponding to a key, a ratio of a charge change amount in each charge accumulation region to a corresponding charge balance amount may be obtained.

Thereafter, S230 is performed as follows: when the ratio of the charge change amount to the charge balance amount in the charge accumulation region corresponding to the key is greater than a first threshold and less than a third threshold, or is equal to the first threshold and less than the third threshold, determining the key is being touched.

In the embodiment, the first threshold is 5% and the third threshold is 10%. In practice, charges may be supplemented to a charge accumulation region corresponding to the key when the key is touched by a finger, and other interference, e.g., putting a cellphone around the key, may cause charge supplement to the charge accumulation region as well. Therefore, only when enough charges are supplemented to the charge accumulation region corresponding to the key, the key is determined to be touched. That is also the reason the second threshold is much greater than the first threshold in the first embodiment.

In the present disclosure, to ensure that charge amounts in each charge accumulation region corresponding to a key reach stability, standard unit capacitors are employed to perform charging. Therefore, the disadvantage of applying capacitance to ground to detect keys in non ground situation in the conventional methods is avoided. Furthermore, two determination standards including a first threshold (e.g., 1%) and a second threshold (e.g., 5%) bring about a more accurate detection for capacitive touch keys. Besides, a third threshold (10%) further eliminates external interference.

Furthermore, in the calculation of charge change amounts, relations between signals are taken into consideration, thereby ensuring the realness of the charge change amounts.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A method for detecting capacitive touch keys, comprising:
    when a touch key is being touched, determining change trends of charge amounts in each charge accumulation region corresponding to a touch key, where the change trends comprise increment and decrement;
    performing charge adjustment to each charge accumulation region corresponding to a touch key until charge amounts in each charge accumulation region corresponding to a touch key reach stability based on the determined change trends, where if the change trend is decrement, charge adjustment is performed to the charge accumulation region until the charge amount in the charge accumulation region reaches a charge balance amount, and if the change trend is increment, charge adjustment is performed to the charge accumulation region until the charge amount in the charge accumulation region reaches a maximum value, where the charge balance amount is the charge amount in the charge accumulation region before the capacitive touch key is touched;
    calculating charge change amounts in each charge accumulation region when the touch key is being touched according to charge adjustment amounts in each charge accumulation region corresponding to a touch key, and calculating the ratio of the charge change amount to the charge balance amount in each charge accumulation region;
    when the change trend of charge amount in the charge accumulation region corresponding to the touch key is decrement, and the ratio of the charge change amount to the charge balance amount in the charge accumulation region corresponding to the touch key is greater than a first threshold and less than a third threshold, or is equal to the first threshold and less than the third threshold, determining the touch key is touched; and
    when the change trend of charge amount in the charge accumulation region corresponding to the touch key is increment, and the ratio of the charge change amount to the charge balance amount in the charge accumulation region corresponding to the touch key is greater than a second threshold and less than the third threshold, or is equal to the second threshold and less than the third threshold, determining the touch key is touched
    where an insulating dielectric layer is formed on the periphery of each touch key, a metal layer is formed on the periphery of the insulating dielectric layer, metal shield rings are formed between adjacent touch keys, and each touch key is connected with a standard unit capacitor.

2. The method according to claim 1, wherein determining change trends of charge amounts in each charge accumulation region corresponding to a touch key comprises: when the touch key is being touched, if the equivalent capacitance of a body and the touch key decreases, the change trend of charge amount in the charge accumulation region corresponding to the touch key is determined to be decrement; if the equivalent capacitance of a body and the touch key increases, the change trend of charge amount in the charge accumulation region corresponding to the touch key is determined to be increment.

3. The method according to claim 1, wherein performing charge adjustment to each charge accumulation region corresponding to a touch key comprises: performing charge supplement to the charge accumulation regions by the discharging of the standard unit capacitor until charge amounts in each charge accumulation region corresponding to a touch key reach stability.

4. The method according to claim 1, wherein performing charge adjustment to each charge accumulation region corresponding to a touch key comprises: performing charge adjustment to each charge accumulation region corresponding to a touch key at a fixed time interval and each charge adjustment action making charge amounts in each charge accumulation region corresponding to a touch key reach stability.

5. The method according to claim 4, wherein the fixed time interval is 5 μs.

6. The method according to claim 1, wherein the standard unit capacitor is a hold capacitor in a sampling hold circuit of an analog-to-digital converter, and the discharging of the standard unit capacitor is controlled by sampling pulses.

7. The method according to claim 6, wherein frequency of the sampling pulses ranges from 80 kHz to 120 kHz.

8. The method according to claim 7, wherein the sampling pulses employ a same frequency.

9. The method according to claim 7, wherein the sampling pulses employ different frequencies.

10. The method according to claim 9, wherein the sampling pulses employing different frequencies comprises: after a charge adjustment action for the first time, sampling pulses employing a larger frequency in a current charge adjustment action than that in a previous one.

11. The method according to claim 9, wherein the sampling pulses employing different frequencies comprises: a frequency varying range being predetermined for sampling pulses; sampling pulses employing a larger frequency in a current charge adjustment action than that in a previous one; and after the frequency of sampling pulses in a charge adjustment action reaches an the highest one in the range, sampling pulses employing a lower frequency in a current charge adjustment action than that in a previous one.

12. The method according to claim 1, wherein when the change trend of charge amount in the charge accumulation region is decrement, the charge adjustment amount in the charge accumulation region is a charge supplement amount to the charge accumulation region of the standard unit capacitor; when the change trend of charge amount in the charge accumulation region is increment, the charge adjustment amount in the charge accumulation region is a difference between a charge amount in the charge accumulation region when the charge amount reaches stability and a charge balance amount.

13. The method according to claim 1, wherein calculating charge change amounts in each charge accumulation region when the touch key is being touched according to charge adjustment amounts in each charge accumulation region corresponding to a touch key comprises: using a charge adjustment amount in a first charge adjustment action as a charge change amount in the first charge adjustment action; from a second charge adjustment action, calculating a weighted sum of a charge adjustment amount in a current charge adjustment action and a charge adjustment amount in a previous charge adjustment action, and taking the weighted sum as a charge change amount in the current charge adjustment action; and averaging charge change amounts of all the charge adjustment actions to obtain an average value and taking the average value as a charge change amount when the touch key is being touched.

14. The method according to claim 13, wherein the weighted sum is calculated based on the following formula:

$$C = C_1 \times N1 + C_2 \times N2,$$

where C is a charge change amount in the current charge adjustment action, $C_1$ is a charge adjustment amount in the previous charge adjustment action, $N_1$ is a first weight of the previous charge adjustment action, $C_2$ is a charge adjustment amount in the current charge adjustment action, $N_2$ is a second weight of the current charge adjustment action, and the sum of $N_1$ and $N_2$ is 1.

15. The method according to claim 14, wherein the first weight is less than the second weight.

16. The method according to claim 15, wherein the first weight is ⅓ and the second weight is ⅔.

17. The method according to claim 1, wherein the first threshold is less than the second threshold.

18. The method according to claim 17, wherein a value of the first threshold is 1% and a value of the second threshold is 5%.

19. The method according to claim 1, wherein a value of the third threshold is 10%.

* * * * *